United States Patent [19]

Jenkins, Jr.

[11] 3,946,211

[45] Mar. 23, 1976

[54] AMPLITUDE LIMITED FILTER

[75] Inventor: Theron W. Jenkins, Jr., Ambler, Pa.

[73] Assignee: Leeds & Northrup Company, North Wales, Pa.

[22] Filed: July 17, 1974

[21] Appl. No.: 489,223

[52] U.S. Cl. .............. 235/151.1; 235/183; 318/611; 325/477; 328/167
[51] Int. Cl.² ....................... G06G 7/66; H04B 1/10
[58] Field of Search ........ 235/183, 193, 197, 151.1; 328/162, 165, 166, 167, 168, 169, 175, 127; 307/237; 179/1 P; 325/473, 474, 475, 476, 477; 318/610, 611; 333/19, 17

[56] References Cited
UNITED STATES PATENTS

| | | | |
|---|---|---|---|
| 3,387,221 | 6/1968 | Arberman et al. ................. | 328/163 |
| 3,602,737 | 8/1971 | Radecke .............................. | 328/167 |
| 3,611,145 | 10/1971 | O'Connor ........................... | 325/474 |
| 3,643,171 | 2/1972 | Chang ................................. | 328/165 |
| 3,654,563 | 4/1972 | Hesler et al. ....................... | 328/167 |
| 3,665,345 | 5/1972 | Dolby ................................. | 328/167 |
| 3,846,719 | 11/1974 | Dolby ................................. | 179/1 P |

FOREIGN PATENTS OR APPLICATIONS 1,111,863   1968   United Kingdom ................. 328/167

OTHER PUBLICATIONS

Korn & Korn: Electronic Analog Computers McGraw Hill 1956, Textbook, p. 13 of interest.

Primary Examiner—Felix D. Gruber
Attorney, Agent, or Firm—William G. Miller, Jr.; Raymond F. MacKay

[57] ABSTRACT

A filter is provided to substantially nullify the effect of process noise of less than a preset amplitude limit on the measurement of a process variable. The filter passes on to a controller or other device all signal changes greater than this amplitude. Within the amplitude limit the signal is damped by a first order lag with a filter time constant typically at least an order of magnitude greater than the average period of the noise to be filtered, but outside the amplitude limit, signal changes are passed immediately with no lag to a device such as a controller. The filter functions by generating a compensating signal essentially duplicating the process noise and then subtracting this compensating signal from the filter input signal, thus canceling this noise from the signal passed to the controller or other device. By subtracting only a limited value of this compensating signal from the filter input, changes of input greater than this limit are not compensated, and are thus immediately passed with no lag. On a sustained change of the input signal, the unlimited compensated signal will decay toward zero at the filter time constant, so that noise centering about the new sustained value of the input will be filtered.

1 Claim, 8 Drawing Figures

AMPLITUDE LIMITED FILTER

BACKGROUND OF THE INVENTION

This invention relates to noise filters for electrical measurements of process variables, and primarily to filters for filtering the noise from signals to controllers so as to prevent controller response to noise in signals. The prior art has utilized standard filter techniques to filter out of signals to controllers all high frequency components which are uncontrollable. In addition, the prior art has also utilized the arrangements of U.S. Pat. Nos. 3,419,772 and 3,633,009 in minimizing the response of controllers to noise signals. Those arrangements use a joint probability function of signal amplitude and duration with the joint probability function being used to modify the gain of the control system, for example.

The present invention provides a means for filtering noise signals from a controller input with apparatus which is considerably simplified with respect to that required in the joint probability approach and which is more selective than the standard filter techniques. There is, therefore, provided by the invention an improved controller input filter which provides improved filtering action at a minimum cost.

SUMMARY OF THE INVENTION

In providing an improved filter the present invention utilizes a method and means for filtering the noise within a limited amplitude range in a measurement signal. That method includes the production of a canceling signal of limited amplitude, which canceling signal represents the lagged rate of change of the signal to be filtered. The time constant of the lag involved in typically at least an order of magnitude longer than the period of the noise which is to be filtered, thus the canceling signal substantially duplicates the noise content to be filtered. The canceling signal is then subtracted from the signal to be filtered so as to cancel those portions of the signal being filtered which are of a magnitude within the chosen amplitude range.

It will be evident that the filter system for carrying out the above method may utilize any of a number of means for producing the canceling signal as required and the means for subtracting the canceling signal from the signal itself may be any of a number of well known circuits for subtracting signals. The means described are shown as electrical circuits, but the invention may also be executed by pneumatic devices or by a digital computer.

With the present invention the low amplitude signals are not passed to the controller when they are in a frequency range which tends to indicate that they are noise signals, however, the controller is allowed to respond to all changes in the controller input signals when those changes are of an amplitude above the limited amplitude range of the filter. Such amplitudes are indicative that the signals are not changes which result from noise. For the purposes of this invention, noise may be considered as those changes in the controlled variable which result from random uncontrollable process disturbances or from unwanted variations in the system for measuring the controlled variable.

DESCRIPTION OF THE PREFERRED EMBODIMENTS

Figure 1:
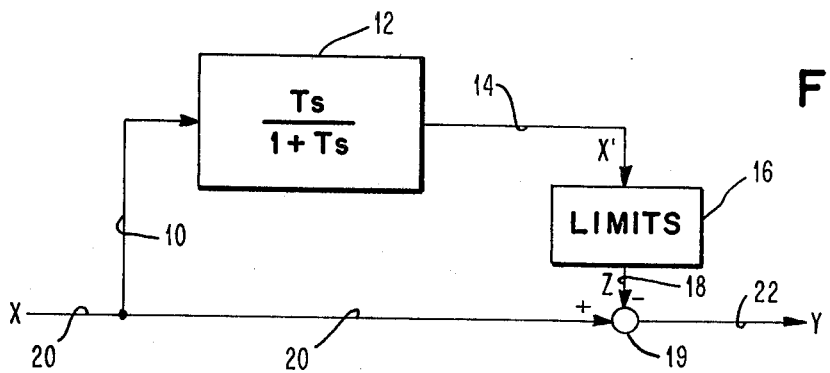
FIGS. 1, 2 and 3 are block diagrams of several configurations of the novel filter system.

FIG. 1 shows one form of the filter system of the present invention wherein an electrical signal $x$ is the signal to be filtered with the filtering being accomplished by the subtraction of the signal $z$ produced by one branch of the circuit from the signal $x$ to produce the filtered signal $y$. In FIG. 1 the signal $x$ is processed in a first branch of the filter in that the signal $x$ is introduced by way of the connection 10 to a circuit shown as block 12. The circuit represented by block 12 may be any circuit which produces an output on the output line 14 which is related to the input from line 10 by the Laplace transform $Ts/(1+Ts)$. Thus, the signal $x'$ on line 14 represents the lagged rate of change of the signal $x$ where the time constant of both the rate and the lag is T.

The $x'$ signals on line 14 are passed through a limiting circuit indicated as block 16 so that there is produced on line 18 a canceling signal $z$, which is subtracted by subtractor 19 from the signal $x$ supplied by way of another branch of the filter represented by connector 20, so that there is produced at the output of the filter on line 22, the filtered signal $y$.

When the canceling signal $z$ does not exceed the limit established by the limiting circuit indicated as block 16, and hence is equal to $x'$, the relationship between the signals $x$ and $y$ for the arrangement of FIG. 1 may be mathematically developed as follows:

$$y = x - z$$

$$z = x \left(\frac{Ts}{1+Ts}\right)$$

$$y = x - x \left(\frac{Ts}{1+Ts}\right)$$

$$y = x \left(1 - \frac{Ts}{1+Ts}\right)$$

$$y = x \left(\frac{1+Ts-Ts}{1+Ts}\right)$$

$$y = x \left(\frac{1}{1+Ts}\right)$$

When $z$ equals $x'$ and hence is not limited, it will be evident that the output signal $y$ is related to the input signal $x$ by a first order lag as represented by the Laplace transform $1/(1+Ts)$.

Figure 2:
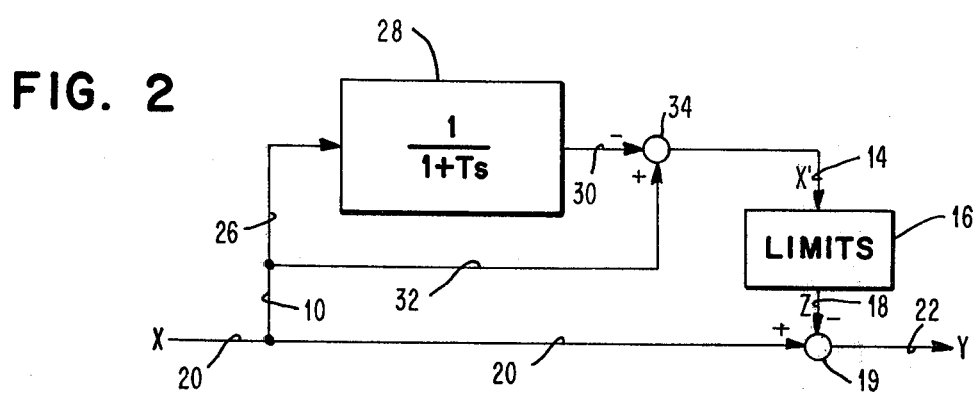

FIG. 2 shows another configuration for executing the filtering method. In FIG. 2 the input signal $x$ is introduced through conductor 10 to one branch of the filter which itself includes another branch including conductor 26 and the circuit represented by the block 28 and its output lead 30. That branch serves to modify the signal $x$ in accordance with the Laplace transform $1/(1+Ts)$. Still another branch is shown as lead 32 which forms an input to subtractor 34 along with the signal on line 30 from block 28 with the signal on line 30 being subtracted from that on line 32 so as to produce on line 14 a signal $x'$ comparable to that on line 14 of FIG. 1. That signal is similarly introduced into a limit circuit 16 to produce on line 18 the canceling signal $z$ which is then subtracted from the signal on line 20, namely, $x$, to produce on line 22 the filtered signal $y$.

The configuration of FIG. 2 produces a relationship between the signal $y$ and the signal $x$ similar to that of FIG. 1 in that the signal $z$ is related to the signal $x$ by a Laplace transfom which is the same as that in FIG. 1. This will be evident from the following mathematical derivation.

$$y = x - z$$

$$z = x - x \left(\frac{1}{1+Ts}\right)$$

$$z = x \left(1 - \frac{1}{1+Ts}\right)$$

$$z = x \left(\frac{1+Ts-1}{1+Ts}\right)$$

$$z = x \left(\frac{Ts}{1+Ts}\right)$$

Figure 3:
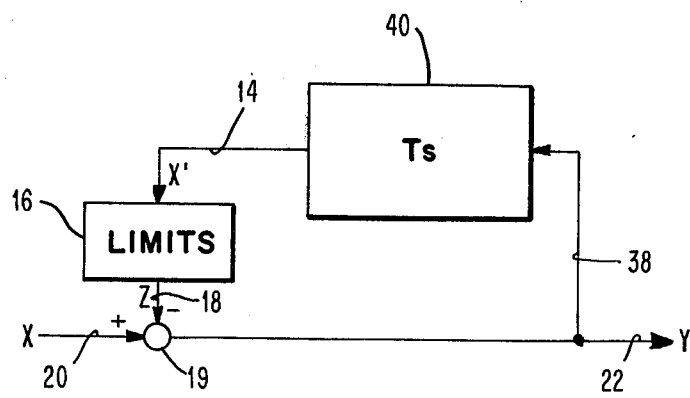

FIG. 3 is another modification of the circuit for carrying out the filtering method of this invention. In FIG. 3 the signal $x$ is introduced over line 20 to the subtractor 19 and the output of the subtractor 19, signal $y$, which appears on line 22, is introduced through conductor 38 to a circuit represented by the block 40 so as to produce on the output line 14 a signal $x'$ similar to that produced on line 14 in FIGS. 1 and 2. As shown in FIG. 3 the circuit represented by block 40 will be a rate circuit which can be represented by the Laplace transform $Ts$. As in FIGS. 1 and 2, the signal $x'$ is passed through the limiting circuit 16 to produce on line 18 the canceling signal $z$ which is subtracted in subtractor 19 from the signal $x$ to produce the signal $y$.

The mathematical derivation below will demonstrate that the signal $z$ when equal to the signal $x'$ is related to the signal $x$ in the circuit of FIG. 3 by a transform similar to that of the relationship of those signals in the configurations of FIGS. 1 and 2 so that the signal $y$ has the same relationship in FIG. 3 to signal $x$ as in FIG. 1.

$$y = x - z$$

$$z = yTs$$

$$y = x - yTs$$

$$y(1+Ts) = x$$

$$y = \frac{x}{1+Ts}$$

$$z = x \left(\frac{Ts}{1+Ts}\right)$$

Figure 4:
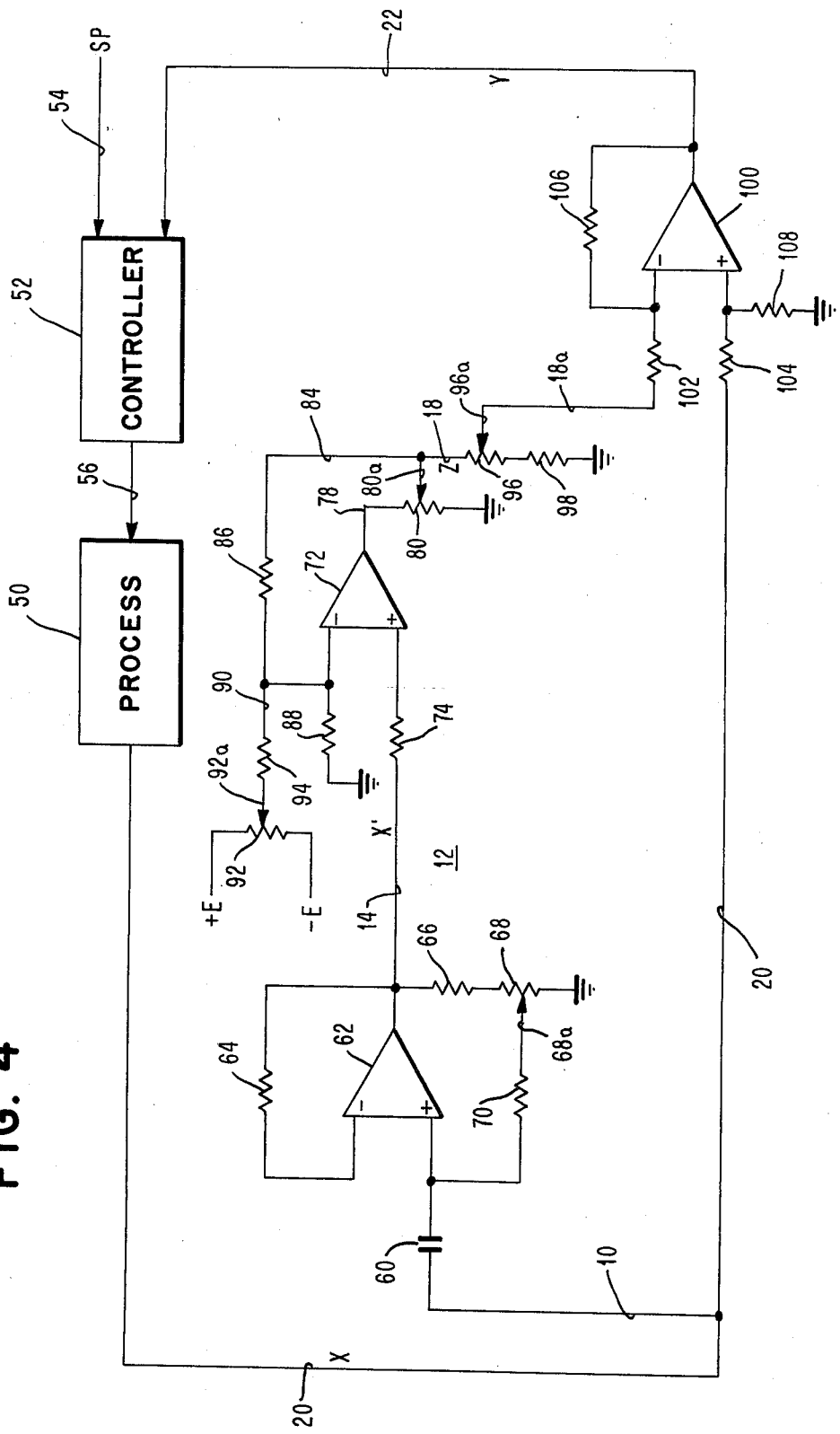
FIG. 4 is a circuit diagram showing one circuit for carrying out the filtering system described in FIG. 1 as it may be applied to an input signal of a process controller.

In FIG. 4 there is shown a preferred circuit for providing a filtering of the input signal to a controller in accordance with the filter configuration of FIG. 1. There is thus shown in FIG. 4 a detailed circuit diagram of the circuit represented in FIG. 1 by block 12. That circuit is shown as receiving a signal $x$ on line 20. The signal $x$ is a measured variable of the process 50 which may, for example, be a variable such as flow. The arrangement of FIG. 4 is designed to filter the measurement of the variable so as to produce a filtered signal on line 22 as an input to controller 52 where the signal is compared with the set point for the variable being measured, as supplied on line 54 to controller 52. The difference between the set point supplied on line 54 and the filtered signal supplied on line 22 provides an error signal in the controller to which the controller can respond to modify the process by way of a control signal on line 56.

While in FIG. 4 the filter circuit is interposed in the line for transmitting the variable to be controlled, it will be evident to those skilled in the art that the filter circuit may be interposed in a line transmitting the error signal to the controller where the measured variable is compared with the set point external to the controller. In that arrangement the filter would be filtering the error signal, however, assuming a constant set point, the result in either arrangement would be the same.

In FIG. 4 the line 10 supplies the signal $x$ to a circuit for producing on line 14 a signal $x'$ which represents the lagged rate of change of $x$. That circuit includes the capacitor 60 connected to receive the signal $x$ on line 10. The capacitor 60 thus connects the signal $x$ to the non-inverting input of differential amplifier 62. The output of the amplifier 62 on line 14 is connected by way of a feedback resistor 64 to the inverting input of the amplifier and there is likewise a connection to ground through the resistor 66 and the potentiometer 68. The potentiometer 68 is arranged to have its contact 68a connected through a resistor 70 to the non-inverting input of the amplifier 62. As will be evident from the table of suggested values for the various components of the circuit of FIG. 4, set forth subsequently, the resistor 70 is desirably of a high resistance, for that resistance and the potential established at the potentiometer contact 68a establishes with capacitor 60 the time constant T of the lag which is introduced in this circuit. It is necessary that the time constant introduced by these components should be longer than the expected period of the noise and preferrably an order of magnitude longer so that signals in the frequency range of the noise expected will pass through the circuit to conductor 14 essentially unchanged in phase with respect to the signal on line 20.

The signal $x'$ on line 14 is introduced to a limiting circuit which is made up of the differential amplifier 72 and its associated circuit components. One of those circuit components is the input resistor 74 which connects the input signal to the non-inverting input of amplifier 72. Amplifier 72 produces an output on line 78 through potentiometer 80 to ground. The potential derived from the potentiometer contact 80a provides over line 84 through feedback resistor 86 a feedback to the inverting input of amplifier 72 which is also connected by way of resistor 88 to ground. The amplifier 72 and its associated circuitry operates as a limit circuit in that the amplifier goes into saturation when the signal on line 14 is outside a limited amplitude range as established by the positioning of contact 80a on potentiometer 80. Means other than by amplifier saturation may also be used as a limit circuit. Such means as the use of diode limiting are well known to those skilled in the art. There may also be supplied to the inverting input of amplifier 72 a bias potential on line 90 which is derived from the potentiometer 92 whose tap 92a is connected through resistor 94 to line 90 so as to supply whatever small potential is needed at the inverting input to correct for offsets in the amplifiers 72 and 62. As shown in FIG. 4 the potentiometer 92 is supplied by positive and negative potential sources +E and −E so that the contact 92a may be adjusted to a ground potential or some small negative or positive potential as required.

The signal derived from the contact 80a of potentiometer 80 on line 18 may be considered the signal $z$. The potential representing the signal $z$ is supplied through the potentiometer 96 and the fixed resistor 98 to ground so that there may be derived from the potentiometer contact 96a when desired, a fractional part of the signal $z$ where it is desired to subtract only a portion of the signal $z$ from the signal $x$ so that there is only a partial cancellation of the noise signals in signal $x$ within the limits established by the limiting circuit.

The signal $z$ or a portion of it as determined by the setting of contact 96a then appears on line 18a as an input to the inverting input of the differential amplifier 100. That input is supplied through the input resistor 102 and is effectively subtracted from the input from line 20 which is introduced to the non-inverting input by way of the input resistor 104. The output on line 22 is then the signal $y$ and that output supplies the necessary feedback through the feedback resistor 106 to the inverting input of amplifier 100. The non-inverting input of amplifier 100 is connected to ground through a fixed resistor 108.

Figure 5A:
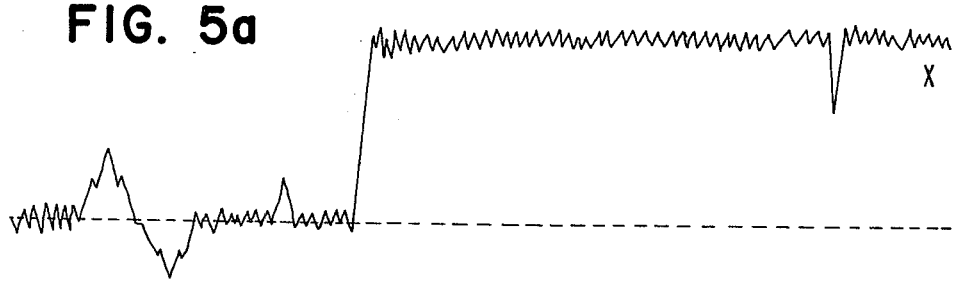
FIGS. 5a, 5b, 5c and 5d are all waveforms of the controller input signal at the various points in its passage through the circuit of FIG. 4.
Figure 5B:
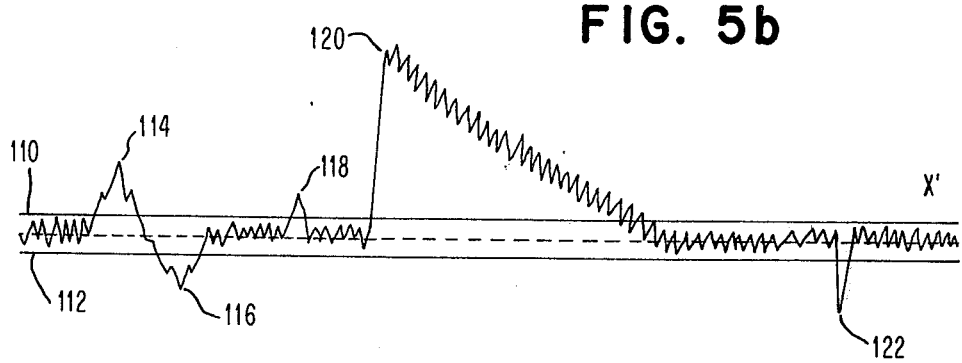

FIGS. 5a, 5b, 5c and 5d show in graphic form the operation of the circuit of FIG. 4. For example, assuming that the waveform of FIG. 5a represents the signal $x$, then the limited amplitude range established by the amplifier 72 and its associated components can be illustrated in FIG. 5b by the solid lines 110 and 112 which are shown as being the bounds of the limiting range. FIG. 5b shows the signal $x'$ and shows how the relatively high frequency noise which is usually of a relatively low amplitude generally falls within the band established by the limit circuit and bounded by the lines 110 and 112. Those noise signals will be transmitted to the non-inverting input of amplifier 100 to be subtracted from $x$ since they are of sufficiently high frequency to pass substantially unchanged through the lagged rate of change circuit of amplifier 62 and they are of sufficiently low amplitude to pass through the limiting circuit of amplifier 72, thus, only the larger amplitude signals such as represented by the peaks 114, 116, 118, 120 and 122 are of sufficient amplitude to drive the amplifier 72 to saturation. It will be noted from FIG. 5b that after reaching the peak 120 the effect of the RC network at the input of amplifier 62 causes the signal level on line 14, for example, to diminish as the capacitor 60 becomes charged. With regard to FIG. 5b it may be assumed that the waveform is that derived from line 14 of FIG. 4.

Figure 5C:
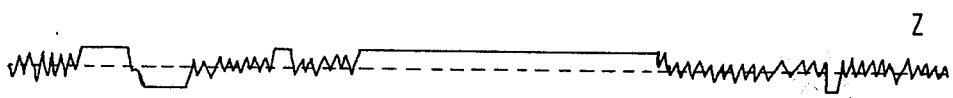
Figure 5D:
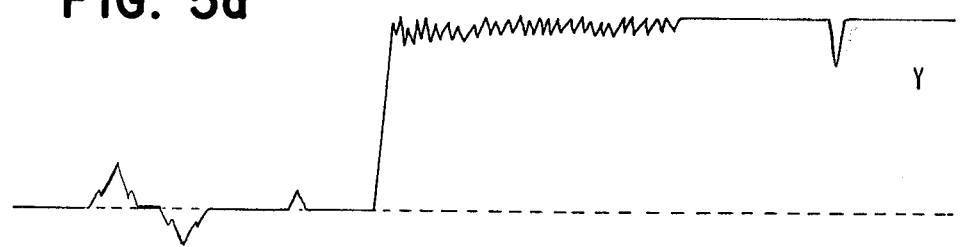

In FIG. 5c the waveform shown representing the canceling signal $z$ is that which would appear on line 18 or on line 18a if the contact 96a is at its limit such that the full signal on line 18 is transmitted to line 18a. It will be noted that the waveform of FIG. 5c shows the effect of the limit caused by the saturation of amplifier 72 in the region of the peaks mentioned above. The waveform shown in FIG. 5d then represents the waveform which would result on line 22 after the waveform of FIG. 5c has been subtracted from the waveform of FIG. 5a and thus represents the signal $y$. It will be evident that what occurs is that the noise signals cancel each other out in the amplifier 100 as long as those noise signals are within the limit amplitude established by the saturation point for amplifier 72 as determined by the contact 80a. Whenever the signal $x'$, and hence $x$, exceeds that limited amplitude range, that portion of $x$ which exceeds the range is transmitted to line 22 since it cannot be canceled out by the signal $z$ on line 18a. Thus, the peaks 114, 116, 118, 120 and 122 appear in the waveform of FIG. 5d as does the noise following the peak 120 which is in that part of the waveform which occurs before the capacitor 60 has charged sufficiently to bring the amplitude of the signal on line 14 below the saturation point for the amplifier 72.

The components of the circuit of FIG. 4 may desirably have the following values:

| COMPONENT | VALUE |
| --- | --- |
| capacitor 60 | 23 μf |
| resistor 64 | 1 meg |
| resistor 66 | 20 ohms |
| potentiometer 68 | 2 k |
| resistor 70 | 1 meg |
| resistor 74 | 20 k |
| potentiometer 80 | 2 k |
| resistor 86 | 200 k |
| resistor 88 | 22.1 k |
| potentiometer 92 | 10 k |
| resistor 94 | 39 M |
| potentiometer 96 | 5 k |
| resistor 98 | 20 k |
| resistor 102 | 200 k |
| resistor 104 | 20 k |
| resistor 106 | 20 k |
| resistor 108 | 200 k |
| operational amplifiers | 308 A |

It will be understood by those skilled in the art that the noise filters disclosed may be connected in cascade, for example, with the first having a relatively small amplitude limit and a long time constant providing the input to a second filter with a larger amplitude limit and a shorter time constant.

What is claimed is:

1. A circuit for filtering from process controller input signals the noise within a limited amplitude range to prevent unnecessary control action in response to said noise comprising:

means for producing a filtering signal related to said input signal by the Laplace transform function $Ts/(1+Ts)$ where T is long with respect to the period of said noise, said filtering means including a differential amplifier having said input signal introduced into its non-inverting inputs through a capacitor and having the non-inverting input connected through a high impedance to ground to establish the time constant T at a value with respect to the period of said noise means for limiting the magnitude of said filtering signal which includes a differential amplifier whose noninverting input receives the output of said filtering means and whose output circuit includes a potentiometer from which is tapped a feedback potential connected to the inverting input for adjustment of the level of the input signal at the non-inverting input necessary to drive the amplifier to saturation and thereby establish said limited amplitude range, and means for subtracting said filtering signal from said input signal.

* * * * *